United States Patent
Chou

(10) Patent No.: US 7,272,684 B1
(45) Date of Patent: Sep. 18, 2007

(54) RANGE COMPARE CIRCUIT FOR SEARCH ENGINE

(75) Inventor: Richard K. Chou, Palo Alto, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 169 days.

(21) Appl. No.: 10/180,357

(22) Filed: Jun. 26, 2002

(51) Int. Cl.
*G06F 12/00* (2006.01)
*G06F 12/08* (2006.01)

(52) U.S. Cl. ..................................... 711/108
(58) Field of Classification Search .............. 711/108
See application file for complete search history.

(56) References Cited

U.S. PATENT DOCUMENTS

| | | |
|---|---|---|
| 3,264,616 A | 8/1966 | Lindquist |
| 3,350,698 A | 10/1967 | Prichard, Jr. |
| 3,389,377 A | 6/1968 | Cole |
| 3,675,211 A | 7/1972 | Raviv |
| 4,065,756 A | 12/1977 | Panigrahi |
| 4,791,606 A | 12/1988 | Threewitt et al. |
| 4,845,668 A | 7/1989 | Sano et al. |
| 4,928,260 A | 5/1990 | Chuang et al. |
| 4,975,873 A | 12/1990 | Nakabayashi et al. |
| 4,996,666 A | 2/1991 | Duluk, Jr. |
| 5,010,516 A | 4/1991 | Oates |
| 5,014,195 A | 5/1991 | Farrell et al. |
| 5,383,146 A | 1/1995 | Threewitt |
| 5,440,715 A * | 8/1995 | Wyland ................. 711/108 |
| 5,444,649 A | 8/1995 | Nemirovsky |
| 6,081,440 A | 6/2000 | Washburn et al. |
| 6,108,227 A | 8/2000 | Voelkel |
| 6,253,280 B1 | 6/2001 | Voelkel |
| 6,266,262 B1 | 7/2001 | Washburn et al. |
| 6,289,414 B1 | 9/2001 | Feldmeir et al. |
| 6,389,507 B1 | 5/2002 | Sherman |
| 6,633,953 B2 * | 10/2003 | Stark ................. 711/108 |
| 6,697,276 B1 * | 2/2004 | Pereira et al. ........... 365/49 |
| 7,035,968 B1 | 4/2006 | Pereira |
| 2002/0007446 A1 | 1/2002 | Stark |

FOREIGN PATENT DOCUMENTS

| | | |
|---|---|---|
| WO | WO99/23663 | 5/1999 |
| WO | WO 02/43069 | 5/2002 |

* cited by examiner

*Primary Examiner*—Sanjiv Shah
*Assistant Examiner*—Midys Rojas
(74) *Attorney, Agent, or Firm*—Haverstock & Owens LLP

(57) ABSTRACT

A range matching circuit (100) may include a range compare circuit (102) that receives a first range value from a first value store (104) and a second range value from a second range store (106). A range compare circuit (102) can determine if a comparand value falls within a range defined by a first and second range value. A comparand value may also be applied to a compare section (112). A compare section (112) can output an active a match result when a comparand value matches at least one entry in the compare section (112).

13 Claims, 6 Drawing Sheets

RANGE COMPARE CIRCUIT FOR SEARCH ENGINE

TECHNICAL FIELD

The present invention relates generally to search engines and more particularly to a search engines that may match data values to predetermined ranges.

BACKGROUND OF THE INVENTION

As is well known in the art, search engines can store a number of values, each of which may represent one entry. A comparand value (or key) may be compared to data values in such entries. The relative rapid speed at which content addressable memories (CAMs) can compare multiple entries to an applied comparand value, as compared to software or other approaches, has resulted in CAMs enjoying widespread use in higher speed applications, such as packet processing.

Conventional CAMs may include binary CAMs and ternary CAMs. Binary CAMs typically include entries that can each store a data value having a number of data bits. In most cases, a match indication can be generated when all bits of a comparand value match all the bits of an entry. CAMs may also include ternary CAMs. Ternary CAMs may typically include entries having data bits, some or all of which may be masked from a compare operation.

A conventional ternary CAM will be briefly described. Referring now to FIG. 13, a portion of a conventional ternary CAM array is set forth in a block diagram and designated by the general reference character 1300. A conventional ternary array 1300 may include a number of CAM cells 1302($m,n$), where m can indicate a particular array row position and n can indicate a particular array column position. Each CAM cell 1302($m,n$) can be connected one or more compare lines and a match line.

In the example of FIG. 13, CAM cells 1302($m,n$) of the same column can be connected to the same complementary compare lines 1304-$m$. Each pair of complementary compare lines 1304-$n$ may carry a comparand value that can be compared to a data value stored within a CAM cell 1302($m,n$). CAM cells 1302($m,n$) of the same row may be connected to the same match line 1306-$n$. In a typical arrangement, CAM cells 1302($m,n$) of the same row may store data bit values for one entry.

Referring now to FIG. 14, a conventional example of a ternary cell is shown in a block diagram and designated by the general reference character 1400. A conventional ternary CAM cell 1400 may include a data store 1402 that may store a data bit value, a mask store 1404 that may store a mask value, and a compare circuit 1406. A compare circuit 1406 can receive a data value, mask value, and comparand value to perform a match operation. While data and mask stores may take various forms, typically some sort of flip-flop type circuit such as a conventional static random access memory (SRAM) type cell, can be used as a data and/or mask store. Similarly, a compare circuit may take a variety of forms, but usually includes an exclusive-OR (XOR) or exclusive-NOR (XNOR) type circuit.

One example of a compare circuit, such as that shown as 1406, is shown in a schematic diagram in FIG. 15. The compare circuit is designated by the general reference character 1500 and may be connected between a match line 1502 and a first potential, VSS. Parallel paths 1504-0 and 1504-1 may be formed between the first potential VSS and a compare node 1506. In addition, a mask circuit 1508 may be formed between the compare node 1506 and the match line 1502. A path 1504-0 may receive a compare value C and an inverse data value D_. Similarly, a path 1504-1 may receive an inverse compare value C_ and a data value D. Thus, when a compare value C does not match a data value D, the paths (1504-0 and 1504-1) may be enabled (i.e., have a low impedance), connecting (discharging) the compare node 1506 to the first potential VSS. In contrast, when a compare value C matches a data value D, the paths are disabled (i.e., have a high impedance), isolating compare node 1506 from the first potential VSS.

A mask circuit 1508 may receive a mask value M_. If a mask value is active (low in this case), a mask circuit 1508 may isolate a match line 1502 from a compare node 1506. Thus, regardless of whether a match exists between a compare value C and a data value D, a match line 1502 may remain isolated from the first potential VSS. Conversely, if a mask value is inactive (high in this case) a mask circuit 1508 may connect a match line 1502 to a compare node 1506. In such a configuration, a match line 1502 may be connected to or isolated from a first potential VSS according to a match/mis-match between a data value D and a compare value C.

In this way, ternary CAMs may provide maskable compare operations.

Various CAM applications can include a variety of types of matching operations. At one end of the spectrum are "exact" match operations, such as those that may be provided by a CAM. However, other applications may include more complicated match operations. For example, in some cases it may be desirable to determine if a given comparand value, or portion thereof, falls within a given range.

Ternary CAMs may provide limited range matching by masking out consecutive bits of lower significance of an entry value. Such an approach may require multiple entries in the event a given matching range does not fall along a bit value boundary. As but one example, an entry 1111 XXXX (where X represents a masked bit) may be used to match a range from 255 (1111 1111) to 240 (1111 0000). However, multiple entries may be needed to match a different range, such as 255 to 246. Such multiple entries may consume too much of the available CAM entry space.

Alternative conventional approaches to providing range matching can include a processor-oriented approach. Such an approach may store upper and lower values of a range. Such values may be compared to a comparand value according to some sort of algorithm to thereby determine if a range match has occurred. Such an approach may take multiple processor cycles, thus consuming more time than a typical CAM match operation.

While various conventional approaches to range matching exist, there remains a need to improve the speed at which range matching can be performed. In addition, or alternatively, there is a need for a range matching solution that does not consume multiple entries, as in the case of some conventional ternary CAM solutions.

SUMMARY OF THE INVENTION

According to the present invention, a range match circuit may include one or more first storage locations for storing a first range value and one or more second range values for storing a second range value. In addition, a range match circuit may include a number of compare sections that compare portions of a comparand value to the first and second range values.

According to one aspect of the embodiments, each compare section can include a first compare circuit with a first compare path. A first compare path may be enabled or disabled according to a comparand bit value and a corresponding first range bit value. A first compare circuit may further include a second compare path that may be enabled or disabled according to the comparand bit value and a corresponding second range bit value. Still further, in particular arrangements first and second compare paths maybe parallel to one another and commonly connected to signal node.

According to another aspect of the embodiments, a range match circuit may include a bypass path between a first compare path and an output node. A bypass path may be enabled by a mode signal.

According to another aspect of the embodiments, a range match circuit may include a bypass path between a first compare path and an output node. A bypass path may be enabled by a mode signal.

According to another aspect of the embodiments, a comparand value may include a number of comparand bit values, and a first range value can include a plurality of first range bit values. Compare sections can have a significance with respect to one another. In addition, each compare section can include a second compare circuit associated with a bit value position. Each second compare circuit can receive a more significant first range match result and provide a less significant first range match result.

According to another aspect of the embodiments, a more significant match result can include a first limit match result and a second limit match result.

According to another aspect of the embodiments, a second range value can include a number of second range bit values. Each second compare circuit can receive a more significant second range match result and provide a less significant second range match result.

According to the present invention, a range compare content addressable memory (CAM) can include at least one range compare circuit. A range compare circuit can determine if a comparand value is within a range defined by a first range value and a second range value.

According to one aspect of the embodiments, a range compare CAM may also include a compare section. A compare section can compare a comparand value to data stored in a number of entries.

According to another aspect of the embodiments, a range compare CAM can include a number of range compare circuits. Each range compare circuit can be connected to a corresponding first and second store pair. Each first and second store pair can store a range limit for a corresponding range compare circuit.

According to another aspect of the embodiments, each range compare circuit includes an input connected to an output of a multiplexer.

According to another aspect of the embodiments, each range compare circuit includes an output connected to a priority encoder.

According to the present invention, a circuit may include one or more result lines and a number of compare sections. Compare sections may be connected to the one result line. Each compare section can connect the result line to a first potential according to a comparison between a comparand value and both a first range value and a second range value.

According to another aspect of the embodiments, a circuit may further include a first storage circuit that stores a first range value and a second storage circuit that stores a second range value.

According to another aspect of the embodiments, compare sections of a circuit may have a significance with respect to one another. More significant compare sections can provide a comparison result to at least one less significant compare section. A comparison result may include a comparison between a comparand value and first and second range data values.

According to another aspect of the embodiments, each compare section includes a first compare circuit connected to a result line and a second compare circuit connected to a first compare circuit of a compare section of less significance.

According to another aspect of the embodiments, each compare section can include a second compare circuit. A second compare circuit can provide a comparison result to a compare section of less significance. A comparison result may be a comparison result between at least a portion of a comparand value and at least a portion of a first and second range values.

According to another aspect of the embodiments, each compare section includes a multiplexer circuit. A multiplexer circuit may receive at least a portion of a number of first range values, and at least a portion of a number of second range values.

According to another aspect of the embodiments, each compare section includes a compare section. A compare section may compare at least a portion of a comparand value to portions of multiple first and second range values.

DETAILED DESCRIPTION OF THE EMBODIMENTS

Various embodiments of the present invention will now be described with reference to a number of diagrams. The embodiments can include a range match circuit that may receive comparand values and determine if all or portions of such a comparand fall within a predetermined range.

Figure 1:
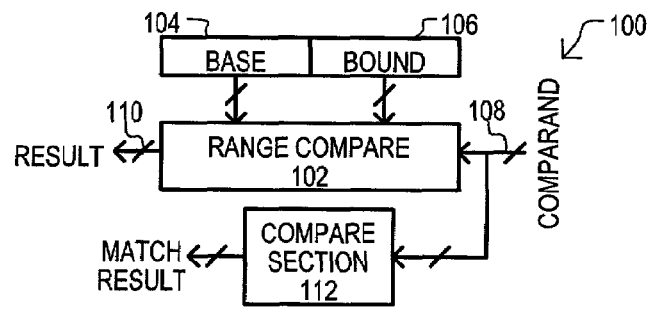
FIG. 1 is a block schematic diagram of a first embodiment.

Referring now to FIG. 1, a range matching circuit according to a first embodiment is set forth in a block diagram and designated by the general reference character 100. A range matching circuit 100 may include a range compare circuit 102, a "base" value store 104, a "bound" value store 106, a comparand input 108, and a result output 110. A range compare circuit 102 may receive a comparand value from a comparand input 108. It is understood that a comparand value may be a complete comparand value applied to a content addressable memory (CAM) device, or a portion of such a comparand value.

A base value store 104 may store one value that can define a first limit of a range. For example, a base value store 104 may store a lower limit of a range. Similarly, a bound value store 106 may store one value that can define a second limit of a range. For example, a bound value store 106 may store an upper limit of a range.

If a comparand value is applied and comparand input 108 is within a range defined by values in base and bound stores (104 and 106), a range match result may be output at result output 110. Conversely, if a comparand value applied to a comparand input 108 is not within a range defined by values in base and bound stores (104 and 106), a range miss value may be output at result output 1110.

Preferably, a range compare circuit 102 compares first and second limits to an applied comparand value essentially simultaneously. As but one very particular example, a range compare circuit 102 may make a series of comparisons starting with a most significant bit of a comparand value and "rippling" through bits of less significance. This is in contrast to an approach that employs separate magnitude comparator operations, one to compare a comparand value to a base value, and another to compare a comparand value to a bound value.

In addition, a range compare circuit 102 may have internal nodes that are preconditioned to particular logic levels prior to a compare operation that can enable a compare operation to be executed in a rapid fashion relative to conventional approaches that may take multiple processor cycles to arrive at a range compare result.

While a range compare circuit according to the present invention may have various applications, one particular application may be in a content addressable memory (CAM). In such a case, a comparand value received at a comparand input 108 may also be applied to a compare section 112. A compare section 112 may be a section that provides conventional content addressable memory matching functions. For example, a compare section 112 may include a number of entries that store data values that may be compared to at least a portion of a comparand value. Even more particularly, a compare section 112 may include an array of CAM cells, where a row of CAM cells may store an entry.

It is noted that unlike conventional ternary CAM range matching approaches that may dedicate entries along bit-wise boundaries, the present invention includes a range matching circuit that may be separate from CAM cells used in a conventional match function.

Figure 2:
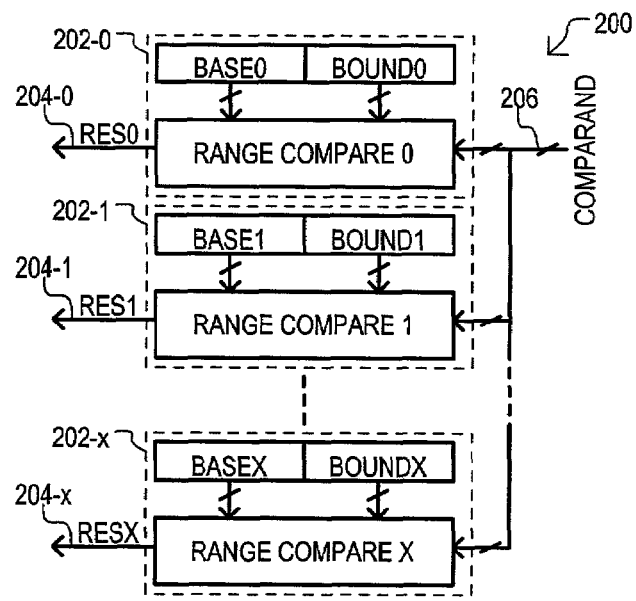
FIG. 2 is a block schematic diagram of a second embodiment.

Referring now to FIG. 2, a "preclassifier" according to a second embodiment is set forth in a block diagram and designated by the general reference character 200. A pre-classifier 200 may include a number of range matching circuits (202-0 to 202-x), such as that set forth in FIG. 1. Thus, each range matching circuit (202-0 to 202-x) may have the same general components as that shown in FIG. 1.

In a pre-classifier according to FIG. 2, each range matching circuit 202-0 to 202-x may have a common comparand input 206. However, each range matching circuit 202-0 to 202-x may include a separate result output 204-0 to 204-x, respectively. Thus, an applied comparand value may be examined in a parallel operation to determine if it falls within any of the ranges defined by base and bound values stored within multiple range matching devices.

In operation, pre-classifier 200 may receive a comparand value. A comparand value may be applied to multiple range matching circuits (202-0 to 202-x) that may determine if the comparand value falls within a predetermined range. Each range matching circuit (202-0 to 202-x) can provide an output (RES0 to RESx) to indicate if a comparand value is within a range.

In this way a second embodiment may provide parallel range matching functions and multiple range match results.

Figure 3:
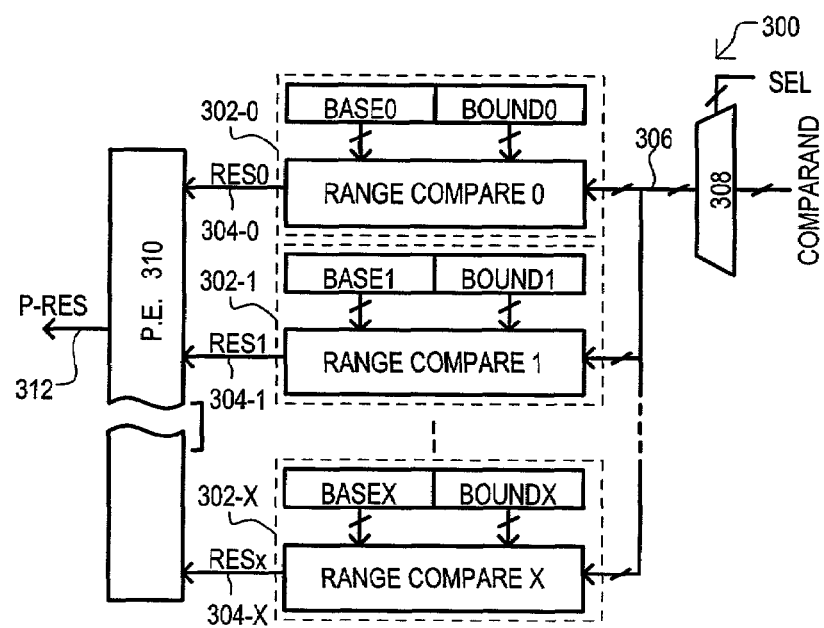
FIG. 3 is a block schematic diagram of a third embodiment.

Referring now to FIG. 3, a pre-classifier according to a third embodiment is set forth in a block diagram and designated by the general reference character 300. A pre-classifier 300 may include some of the same general constituents as FIG. 2. To that extent like portions are referred to by the same reference character but with the first digit being a "3" instead of a "2." Thus, a third embodiment 300 may include multiple range matching circuits (302-0 to 302-x), may have a common comparand input 306, and separate result outputs 304-0 to 304-x.

Unlike a second embodiment 200, a third embodiment 300 may include an input multiplexer (MUX) 308, a result priority encoder 310, and a prioritized result output 312. An input MUX 308 may selectively apply portions of a comparand value to range matching circuits (302-0 to 302-x). Thus, while a comparand value may be received by a pre-classifier 300, a portion of such a comparand value may be selectively applied to range matching circuits (302-0 to 302-x). Such an arrangement may allow for rapid processing of packet data or the like, where packet classification may be determined according to whether a selected field or fields fall within a predetermined range.

A priority encoder 310 may receive multiple range match results (RES0 to RESx) and select an output result (P-RES) according to a predetermined priority. As but two examples, priority may be based on physical position or a programmable value. An output result (P-RES) may be a value encoded according to an activation of a highest priority range match result.

In operation, a pre-classifier 300 may receive a comparand value. An input MUX 308 may apply a selected portion of a comparand value to a comparand value input 306. In FIG. 3, a portion of a comparand value may be selected according to select signals SEL.

A selected comparand value portion may be applied to multiple range matching circuits (302-0 to 302-x). If the selected comparand value portion falls within a predetermined range of a range matching circuit (302-0 to 302-x) the range matching circuit 300 may generate an active range match output signal (RES0 to RESx). If no range match output signals (RES0 to RESx) are active, a result priority encoder 310 may output a predetermined "no match" value at a prioritized result output 312. If one range match output signal (RES0 to RESx) is active, a result priority encoder 310 may output such a range match value as an encoded signal, or the like, on a prioritized result output 312. If two or more range match output signals (RES0 to RESx) are active, a result priority encoder 310 may output one range match value as an encoded signal, or the like, on a prioritized result output 312 according to a predetermined priority.

In this way, portions of a comparand value may be selectively applied to multiple range matching circuits. In addition or alternatively, result outputs from multiple range matching circuits may be prioritized.

Figure 4:
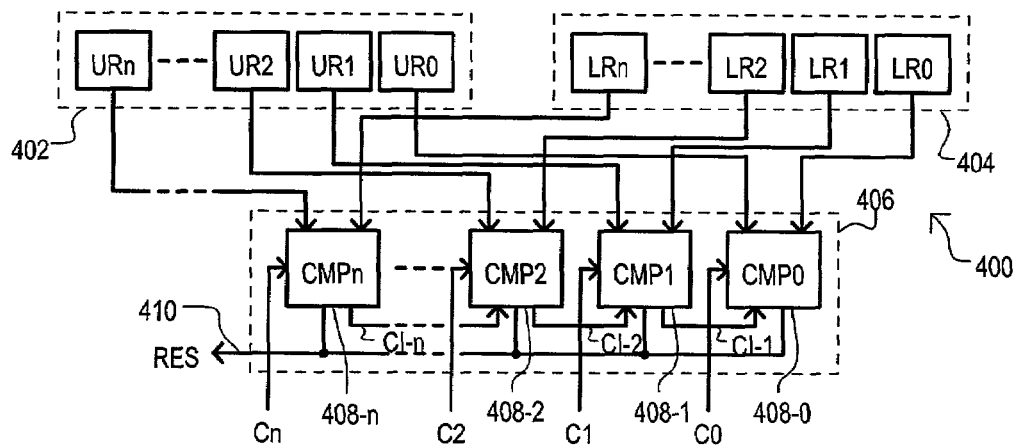
FIG. 4 is a block schematic diagram of a fourth embodiment.

Referring now to FIG. 4, a range match circuit according to a fourth embodiment is set forth in a block schematic diagram. A range match circuit is designated by the general reference character 400 and may include a first limit store 402, a second limit store 404, and a compare section 406. In the particular example of FIG. 4, first and second limit stores (402 and 404) may store range limits as bit values. Further, a first limit store 402 may store an upper limit (e.g., a bound) while a second limit store 404 may store a lower limit (e.g., a base). Various bits of a first limit store 402 are shown as URn to UR0. Similarly, various bits of a lower limit of second limit store 404 are shown as LRn to LR0.

A compare section 406 may include compare sections 408-$n$ to 408-0. Each compare section (408-$n$ to 408-0) may receive a bit value from a first limit store 402 and a second limit store 404. In addition, each compare section (408-$n$ to 408-0) may also receive a comparand bit value (Cn to C0). In response to a compare operation, a compare section (408-$n$ to 408-0) may generate a response on a response line 410. In addition, a compare section (408-$n$ to 408-0) may supply compare information to a next compare section (408-$n$ to 408-0). Thus, a compare section 408-2 may supply compare information (CI-2) to a compare section 408-1. Such compare information may enable and/or disable a compare operation in a next stage.

In the example of FIG. 4, because a compare section 408-0 can be considered a "last" compare stage, it may not supply any compare information.

Figure 5:
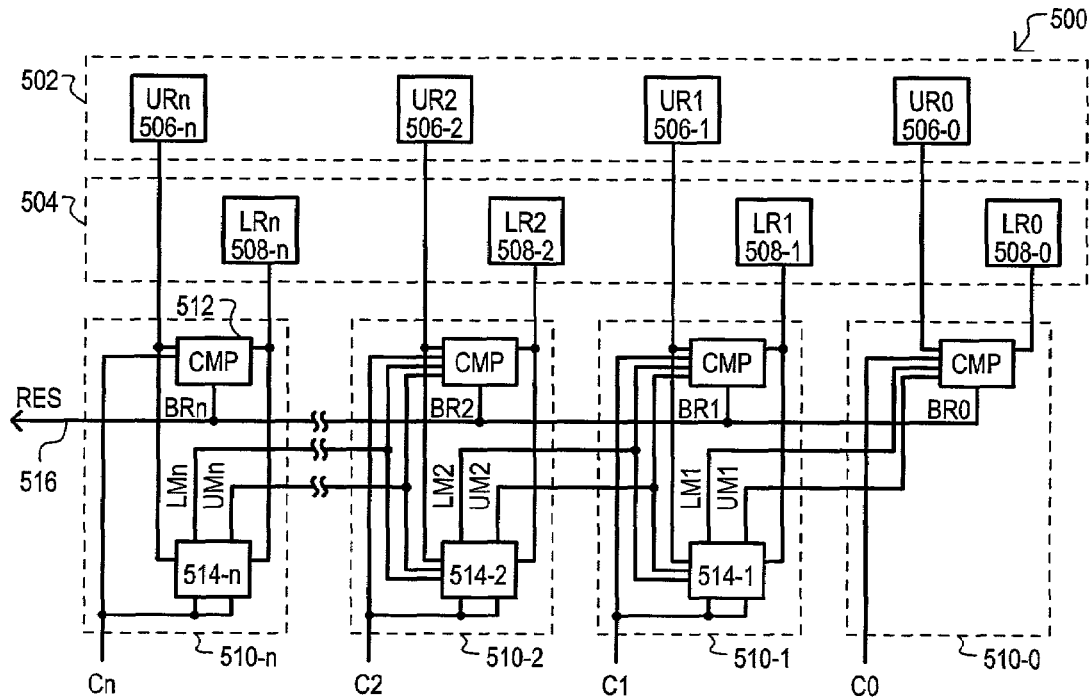
FIG. 5 is a block schematic diagram of a fifth embodiment.

FIG. 5 discloses one example of a range match circuit according to one particular embodiment. In FIG. 5, a range match circuit is designated by the general reference character 500, and may include a first limit store 502 that may store a first range value and a second limit store 504 that may store a second range value. As but one example, a first range value may be an upper range value that includes the bits URn to UR0, while a second range value may be a lower range value that includes the bits LRn to LR0.

In one very particular case, a first limit store 502 and/or a second limit store 504 may include a static random access memory (SRAM) type cell. Data may be read from and written to storage circuits by activation of a word line (not shown) or the like, that may connect one or more bit lines (not shown) to a storage circuit.

Further, it is understood that a first limit store 502 and/or a second limit store 504 may provide complementary data/range values. In one particular arrangement, a first limit store 502 may include a number of first storage circuits 506-0 to 506-$n$, each of which may store a portion of a first limit value (e.g., one bit). Similarly, a second limit store 504 may include a number of second storage circuits 508-0 to 508-$n$, each of which may store a portion of a second limit value (e.g., one bit). Of course, a value provided by a first or second storage circuit (506-0 to 506-$n$ or 508-0 to 508-$n$) may be a complementary value.

As shown in FIG. 5, a range match circuit 500 may further include a number of compare sections 510-0 to 510-$n$. Each compare section (510-0 to 510-$n$) may correspond to a particular first limit value and second limit value. For example, in FIG. 5, compare section 510-$n$ may correspond to first limit value URn and second limit value LRn.

Each compare section (510-0 to 510-$n$) may include a first compare circuit, one of which is shown as 512. A first compare circuit 512 may compare a comparand value to values received from associated first and second storage circuits (506-0 to 506-$n$ and 508-0 to 508-$n$). Thus, the compare circuit 512 of compare section 510-$n$ may compare a comparand value Cn with values from a first storage circuit 506-$n$ with a value from second storage circuit 508-$n$.

One particular operation of a first compare circuit 512 will now be described.

A first compare circuit 512 may compare a comparand bit value (Cn to C0) to a corresponding first range bit value (URn to UR0) and second range bit value (LRn to LR0). Unlike conventional CAM match operations, match/mismatch indications may be generated according to how a comparand bit value (Cn to C0) differs from first and second range bit values (URn to UR0 and LRn to LR0). In addition, such a match/mismatch indication can vary according to a range bit comparison of a more significant bit.

Referring back to FIG. 5, various compare sections (510-1 to 510-$n$) may include second compare circuits (514-$n$ to 514-1). In the arrangement of FIG. 5, second compare circuits (514-$n$ to 514-1) may compare a comparand bit value (Cn to C1) to corresponding first and second range bit values (URn to UR1 to LRn to LR1). According to such a comparison, and a more significant comparison result, second compare circuits (514-$n$ to 514-1) can generate lower range match values (LMn to LM1) and upper range match values (UMn to UM1).

Upper and lower range match values (UMn to UM1 and LMn to LM1) from one compare section (510-0 to 510-$n$) may be provided to a compare section of lower significance. Thus, a compare section 510-2 may provide upper and lower range match values UM2 and LM2 to a compare section 510-1. Similarly, a compare section 510-1 may provide upper and lower range match values UM1 and LM1 to a compare section 510-0.

Having described various portions of a particular range match circuit for FIG. 5, a first example of a range matching operation will now be described in more detail.

For the given example, it will be assumed that a first limit store 502 and second limit store 504 each store four bit values. Further, a first limit store 502 stores an upper range limit of 1100 (URn=1, UR2=1, UR1=0 and UR0=0), and a second limit store 504 stores a lower limit of 0111 (LRn=0, LR2=1, LR1=1 and LR0=1). It will also be assumed that a digit significance decreases from left to right in FIG. 5. Finally, it will be assumed that a first comparand value of 1110 is applied (Cn=1, C2=1, C1=1 and C0=1). That is, an applied comparand value is greater than a range indicated by upper and lower range limits.

Within a compare section 510-$n$, a most significant comparand bit "1110" (underlined) can be compared in a first compare circuit 512 to determine if it is less than the corresponding upper range limit bit "1100" (underlined). Because the comparand bit is not greater than the upper range bit, the first compare circuit can generate a match indication. In addition, a second compare circuit 514-$n$ can generate an active upper range match result that can enable an upper range comparison to continue within a next compare section 510-2 of less significance.

Within a compare section 510-2, because the next most significant comparand bit "1110" (underlined) is not greater than the corresponding upper range limit bit "1100" (underlined), a first compare circuit can generate a match indication, while a second compare circuit 514-2 can enable a compare operation to continue within a next compare section 510-1 of less significance.

Within a compare section 510-1, because a third comparand bit "1110" (underlined) is greater than a third upper range limit bit "1100" (underlined), the comparand value 1110 can be considered greater than an upper range limit 1100, and thus is outside the range. In response, a first compare circuit within compare section 510-1 can generate a mismatch indication at output BR1. In one very particular arrangement, a mismatch indication at any of outputs BRn to BR0 can place a result line 516 in a first state (e.g., discharge a result line 516).

It is noted that at the same time a comparand value is compared with an upper range limit, the comparand value may be compared with a lower range limit. Thus, in the above example, initially, a most significant comparand bit "1110" (underlined) can be compared in a first compare circuit 512 of first compare section 510-n to determine if it is less than the corresponding lower range limit bit "0111" (underlined). Because the comparand bit is greater than the lower range bit, the comparand can be assumed to be within a lower range limit. Thus, a first compare circuit 512 can generate a match indication. In one very particular arrangement, if all outputs BRn to BR0 generate a match indication, a discharge a result line 516 can be in a second state (e.g., maintained in a precharged state).

Continuing with a description of a lower range comparison, a second compare circuit 514-n can generate an inactive lower range match result (LMn). This can cascade through remaining first and second compare circuits (those corresponding to less significant bits), essentially disabling compare operations. Such an operation can prevent less significant bit comparisons with a lower range from generating a mismatch indication.

A second example of a range matching operation will now be described.

In this second example, it will be assumed that a first limit store 502 stores an upper range value of 1100 and a second limit store 504 stores a lower range limit value of 0111. Further, it will be assumed that a first comparand value of 1000 is applied. That is, the applied comparand value falls within a range defined by an upper and lower limit.

Within a first compare section 510-n, a most significant comparand bit "1000" (underlined) can be compared in a first compare circuit 512 to determine if it is less than the corresponding upper range limit bit "1100" (underlined). Because the comparand bit is not greater than the upper range limit bit, an upper range comparison may continue to a next significant bit.

Within a next compare section 510-2, because a second comparand bit "1000" (underlined) is less than the corresponding upper range bit "1100" (underlined), the comparand can be determined to be within an upper range limit. Thus, a first compare circuit within compare section 510-2 can generate a match indication. In addition, a second compare circuit 514-2 can generate an inactive upper range match result that can cascade through remaining compare sections (those corresponding to less significant bits), essentially disabling upper range compare operations on bits of lower significance. This can prevent such less significant bit comparisons from generating mismatch indications.

The lower range comparison in the second example may proceed in the same fashion as that of the first example.

Thus, with both upper and lower range comparisons indicating a match, and preventing any lower significance mismatches from occurring, a match indication can be generated indicating the given comparand is within the lower and upper range limits.

A third example of a range matching operation will now be described.

For the following third example, it will be assumed that a first and second limits stores (502 and 504) store upper range values of 1100 and a lower range values of 0111, as in the previous examples. It will be further assumed that a first comparand value of 0011 is applied. That is, a comparand is less than a range indicated by upper and lower range values.

An upper range comparison of this third example may proceed in the same fashion as that of the second example. Thus, an upper range comparison will indicate that the comparand value is within an upper range limit.

In a corresponding lower range comparison, within a compare section 510-n, a most significant comparand bit "0011" (underlined) can be compared in a first compare circuit to determine if it is less than the corresponding lower range limit bit "0111" (underlined). Because a comparand bit is not less than the lower range bit, a first compare circuit can generate a match indication.

Within a next compare section 510-2, a second compare circuit 514-2 can generate an active lower range match result LM2 that can enable a lower range comparison to continue with the next significant bit. In this third example, because a second comparand bit "0011" (underlined) is less than the second lower range limit bit "0111" (underlined), a comparand value 0011 can be considered less than a lower range limit 0111, and thus is outside the location range. Accordingly, a first compare circuit within a compare section 510-2 can generate a mismatch indication.

As noted above, one mismatch indication can change the state of a result line 516.

In this way, upper and lower range limits comparisons may be performed on an applied comparand value to generate a match indication if the comparand value is within the range limits, and a mismatch indication if the comparand value is outside the limits.

Further, in one approach, comparisons may be made on a bit-by-bit basis by compare sections. If any compare sections generate a mismatch indication (i.e., the comparand value is out of range) a response line can be driven to a second value. However, if all compare sections generate a match indication, a response can maintain a first value. In one very particular approach, a response line may be precharged to a first value, and a mismatch from any compare section may discharge the response line to a second value.

By providing such a range matching capability, according to the above embodiments, a range matching circuit may be included in a CAM. This may enable various ranges to be stored in a more compact fashion, as ranges do not necessarily have to fall along bit boundaries, as is the case in conventional ternary CAM approaches.

Having described an example of a range matching circuit in FIG. 5 that may include first compare circuits (e.g., 512) and second compare circuits (510-n to 510-0), one particular example of a first compare circuit will now be described.

Figure 6:
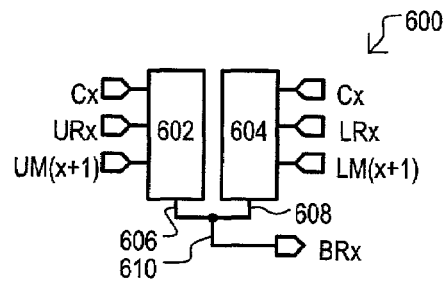
FIG. 6 is a block schematic diagram of a compare circuit according to an embodiment.

Referring now to FIG. 6, a block diagram is set forth showing a first compare circuit. In FIG. 6, a first compare circuit is designated by the general reference character 600 and may include an upper range match section 602 and a lower range match section 604.

An upper range match section 602 may receive a comparand value Cx, an upper range value URx, and a more significant bit upper range match result UM(x+1). Provided upper range match result UM(x+1) is active, an upper range match section 602 can generate a mismatch result at a upper range output 606 when a comparand value Cx is greater than an upper range value URx. A match result may be generated at an upper range output 606 when a comparand value Cx is not greater than an upper range value URx. However, if upper range match result UM(x+1) is inactive, a match result can be generated at an upper range output 606 regardless of the values of Cx and URx.

It is understood, and will shown below, that the particular polarities of signals received by an upper match section 602 can vary according to the logic of the upper match section 602. Thus, a received comparand value Cx may include an inverted value Cx_, a non-inverted value Cx, or both. The same can be true for other signals received by an upper match section 602 (e.g., URx and UM(x+1)).

In a similar fashion to an upper range match section 202, a lower range match section 604 may receive a comparand value Cx, a lower range value LRx, and a more significant bit lower range match result LM(x+1). Provided a lower range match result LM(x+1) is active, a lower range match section 604 can generate a mismatch result at a lower range output 608 when a comparand value Cx is less than a lower upper range value URx. A match result may be generated when a comparand value Cx is not lower than an upper range value LRx. However, if lower range match result UM(x+1) is inactive, a match result can be generated at a lower range output 608 regardless of the values of Cx and LRx.

Again, the polarity of various values received by a lower range match section 604 may also vary according to the particular logic of the lower range match section 604.

Referring still to FIG. 6, should a mismatch indication be generated at either an upper range output 606 or a lower range output 608, a mismatch indication can be generated at an output 610. As shown in FIG. 6, upper and lower range outputs (606 and 608) may be coupled to one another, or be the same node. Such an arrangement may work with a precharged match node 610 that can be discharged by a mismatch indication.

Figure 7:
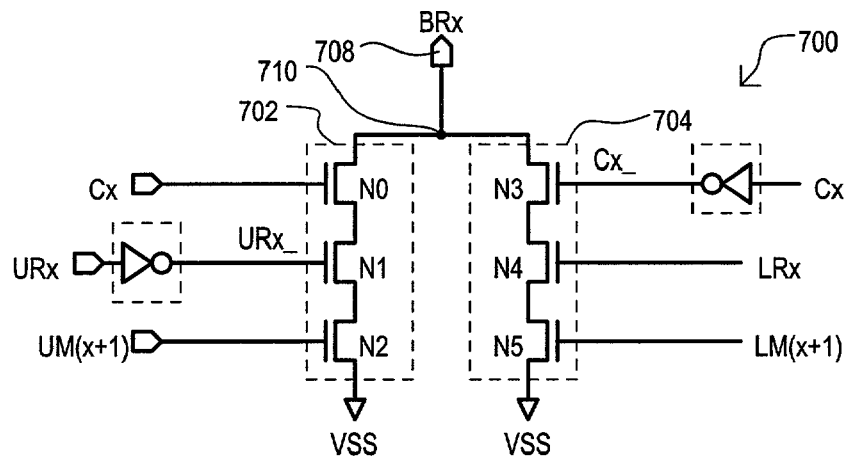
FIG. 7 is a schematic diagram of a first compare circuit according to an embodiment.

A more detailed example of a first compare circuit is set forth in FIG. 7, and designated by the general reference character 700. A first compare circuit 700 may include a first circuit path 702 and a second circuit path 704. In particular, a first circuit path 702 may be enabled/disabled according to a comparand value Cx, an upper range value URx_, and a more significant upper match result UM(x+1). A second circuit path 704 may be enabled/disabled according to a comparand value Cx_, a lower range value LRx, and a more significant lower match result LM(x+1).

In the particular example of FIG. 7, a first circuit path 702 may include transistors N0-N2 having source-drain paths arranged in series. Transistors N0-N2 may include n-channel insulated gate field effect transistors (IGFETs), as but one example. Transistor N0 may receive a comparand value Cx at its gate. The gate of transistor N1 can receive an upper range value URx_. The gate of transistor N2 can receive a more significant upper match result value UM(x+1) at its gate.

In the particular example of FIG. 7, a second circuit path 704 may include transistors N3-N5 having source-drain paths arranged in series. Transistors N3-N5 may include n-channel insulated gate field effect transistors (IGFET), as but one example. Transistor N3 may receive a comparand value Cx at its gate. The gate of transistor N4 can receive a lower range value LRx. The gate of transistor N5 can receive a more significant lower match result value LM(x+1).

In one arrangement, as shown in FIG. 7, first and second signal paths (702 and 704) can be arranged in parallel between a signal node 710 and a first predetermined potential (e.g., VSS).

Having described the general arrangement of first compare circuit 700, the operation of the first compare circuit 700 will now be described.

In operation, upper and lower match results (UM(x+1) and LM(x+1)) can vary according to more significant bit match results. If a more significant upper range match result UM(x+1) is active, a comparand value Cx can be compared with an upper range value URx_ within a first circuit path 702. If a comparand value is high, and an upper range value URx_ is low, a comparand value can be outside an upper range, and a first circuit path 702 can be enabled. If a more significant upper range match result UM(x+1) is inactive, transistor N2 can be turned off, and a first circuit path 702 can be forced into a disabled state.

In this way, a first circuit path 702 may provide an indication reflecting a comparison between a comparand value Cx and an upper range value URx_.

It is noted that first circuit path 702 may include transistor N2 and second circuit path can include transistor N5. Such transistors (N2 and N5) can operate together to isolate a signal node 710 from a ground potential in a pre-conditioning operation. Such an operation will be described in more detail below.

Further, FIG. 7 shows an inverter that may generate an upper range value URx_ by inverting a value URx. It is understood that such an inverter may not be included if other circuits provide an upper range value URx_. Similarly, an inverter is shown that may generate a comparand value Cx from a value Cx. Such an inverter may not be included if other circuits provide a comparand value Cx_.

Within a second circuit path 704, if a more significant lower range match result LM(x+1) is active, a comparand value Cx_ can be compared with a lower range value LRx within a second circuit path 704. If a comparand value is low, and a lower range value LRx is high, a comparand value can be outside a lower range, and a second circuit path 702 can be enabled. If a more significant lower range match result LM(x+1) is inactive, transistor N5 can be turned off, and a second circuit path 702 can be forced into a disabled state. In this way, a second circuit path 704 may provide an indication reflecting a comparison between a comparand value Cx_ and a lower range value LRx.

A signal node 710 can be connected to an output 708. Thus, when a comparand exceeds an upper range, a first circuit path 702 can be enabled, connecting an output 708 to a first potential VSS. Similarly, when a comparand falls below a lower range, a second circuit path 704 can be enabled, connecting an output 708 to a first potential VSS. However, if a comparand value is less than an upper range and greater than a lower range, first and second circuit paths (702 and 704) can both be disabled, isolating an output 708 from a first potential VSS.

An example of a second compare circuit will now be described with reference to FIG. 8A. A second compare circuit is designated by the general reference character 800 and may include an upper range portion 802 and a lower range portion 804. An upper range portion 802 can receive a comparand value Cx, an upper range value URx, a more significant upper match result UM(x+1), and a mode value RNGE. An upper range portion 802 can provide an upper range match result UNIx.

An upper range match result UMx can vary according to whether a more significant upper range match result UM(x+1) is active or inactive. More particularly, an inactive (low in this case) upper range match result UM(x+1) can force the lower significance upper range match result UMx to an inactive state. If a more significant upper range match result UM(x+1) is active (high in this case), a lower significance upper range match result UMx can vary according to whether a comparand value Cx is different than an upper range match result URx.

A lower range portion 804 can receive a comparand value Cx, a lower range value LRx, a more significant lower match result LM(x+1), and a mode value RNGE. A lower range portion 804 can provide a lower range match result LMx.

In operation, a lower range match result LNX can vary according to whether a more significant lower range match result LM(x+1) is active or inactive. An inactive (low in this case) lower range match result LM(x+1) can force the lower significance upper range match result LMx to an inactive state. If a more significant lower range match result LM(x+1) is active (high in this case), a lower significance upper range match result LMx can vary according to whether a comparand value Cx is different than a lower range match result LRx.

Figure 8A:
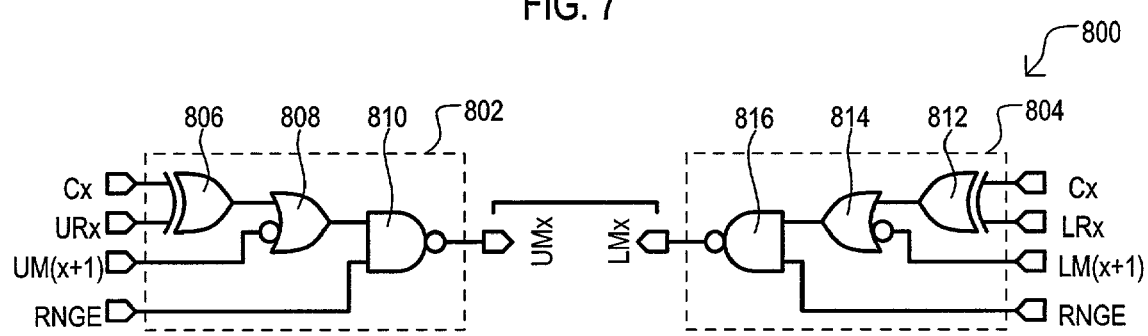
FIG. 8A is a schematic diagram of a second compare circuit according to an embodiment.

In the example of FIG. 8A, an upper range portion 802 may include a two-input exclusive OR (XOR) gate 806 that receives a comparand value Cx as one input and an upper range value URx as another input. An output of XOR gate 806 may be provided as an input to an OR gate 808. Another input to OR gate 808 may receive an inverted more significant upper range match result UM(x+1). An output of OR gate 808 may be provided as an input to a NAND gate 810. Another input to NAND gate 810 may receive a mode value RNGE. An output of NAND gate 810 can be the upper range match result value UMx.

In the example of FIG. 8A, a lower range portion 804 has the same general construction as an upper range portion 802, including a XOR gate 812 that receives a comparand value Cx and a lower range value LRx, an OR gate 814 connected to the output of XOR gate 812 and an inverted more significant lower range match result LM(x+1), and a NAND gate 816 connected to the output of OR gate 814 and a mode signal RNGE. An output of NAND gate 816 can be a lower range match result value LMx.

In operation, a mode value RNGE can be high, forcing NAND gates 810 and 816 to function essentially as inverters. Within an upper range portion 802, in the event a more significant upper match result UM(x+1) is inactive (low), a high value will be input to OR gate 808. This can force the output of OR gate 808 high. With the output of OR gate 808 and a mode value RNGE both high, an upper range match result UMx can be forced inactive (low). In this way, an inactive more significant upper match result UM(x+1) can force a less significant upper match result UM(x+1) to an inactive state.

However, if a more significant upper match result UM(x+1) is active (high), a low value will be input to OR gate 808. Thus, OR gate 808 can pass through the output of XOR gate 806. Consequently, if the output of XOR gate 806 is low, indicating a comparand value Cx is the same as an upper range value URx, upper range match result UMx can be active (high). Conversely, if an output of XOR gate 806 is high, indicating a comparand value is different than an upper range value URx, upper range match result UMx can be forced to an inactive state.

From the above detailed description of the upper range portion 802, the operation of the lower range portion 804 naturally follows.

Of course, the particular second compare circuit of FIG. 8A may take a variety of forms and be implemented in various ways. Accordingly, the particular logic and signal polarities shown in FIG. 8 should not be construed as limiting the invention to such particular structures. One skilled in the art could arrive at alternate logic to perform a same or similar function. Further, such alternate logic could receive input values of different polarity than those shown in FIG. 8A, or complementary sets of such values.

Figure 8B:
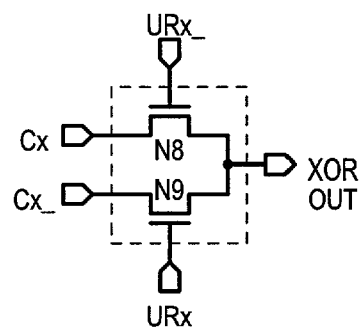
FIGS. 8B and 8C are schematic diagrams of exclusive-OR (XOR) circuits that may be included in a second compare circuit according to an embodiment.
Figure 8C:
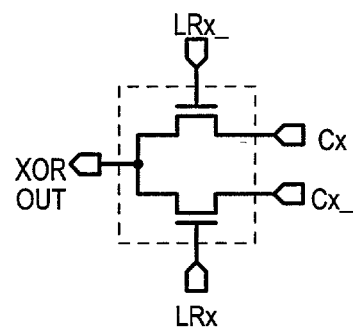

While FIG. 8A shows particular XOR gates 806 and 812, in a preferred approach, such gates may be "passgate" type XOR gates, and operate in conjunction with particular comparand value precharging functions. Examples of such a passgate-type XOR gates are set forth in FIGS. 8B and 8C. FIG. 8B shows as XOR gate that may be used as XOR gate 806 in FIG. 8A. FIG. 8C shows as XOR gate that may be used as XOR gate 812 in FIG. 8A. Particular precharge and preconditioning functions that utilize such gates will be described in more detail below.

The above embodiments have indicated that a range match circuit can be associated with particular upper and lower range values. However, such a correspondence does not have to be one-to-one. That is, a range match circuit may be shared among multiple sets of upper and lower range values. In such an arrangement, upper and lower range values may be sequentially entered from different sets of value stores.

Figure 9:
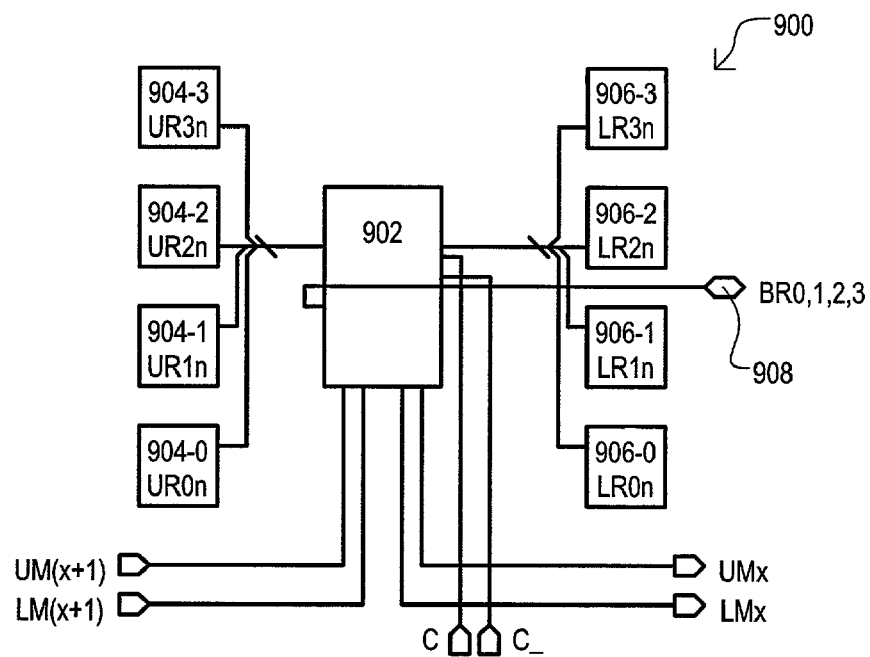
FIG. 9 is a block diagram showing a compare section sharing arrangement according to an embodiment.

One example of a sharing arrangement is set forth in FIG. 9, and designated by the general reference character 900. Referring now to FIG. 9, a sharing arrangement 900 according to one embodiment may include a shared compare section 902 that is shared among multiple locations. In the particular example of FIG. 9, a shared compare section 902 may be shared among four sets of storage locations.

First storage locations 904-3 to 904-0 may store an nth data bit of four different first range limits, such as upper range limits. Similarly, second storage locations 906-3 to 906-0 may store an nth data bit a four different second range limits, such as lower range limits.

First storage locations (904-3 to 904-0) can provide first range values (UR3n to UR0n) to a shared compare section 902. Second storage locations (906-3 to 906-0) can provide second range values (LR3n to LR0n) to a shared compare section 902. A compare section 902 may also receive a comparand value C/C_, as well as more significant first and second range match values (UM(x+1) and LM(x+1)). In response to such values, a shared compare section 902 may generate match/mismatch indications on a result line 908 according to whether a comparand value is within a range established first and second range values. A compare section 902 may also generate more significant first and second range match values (UMx and LMx) for a shared compare section corresponding to a less significant bit.

Figure 10:
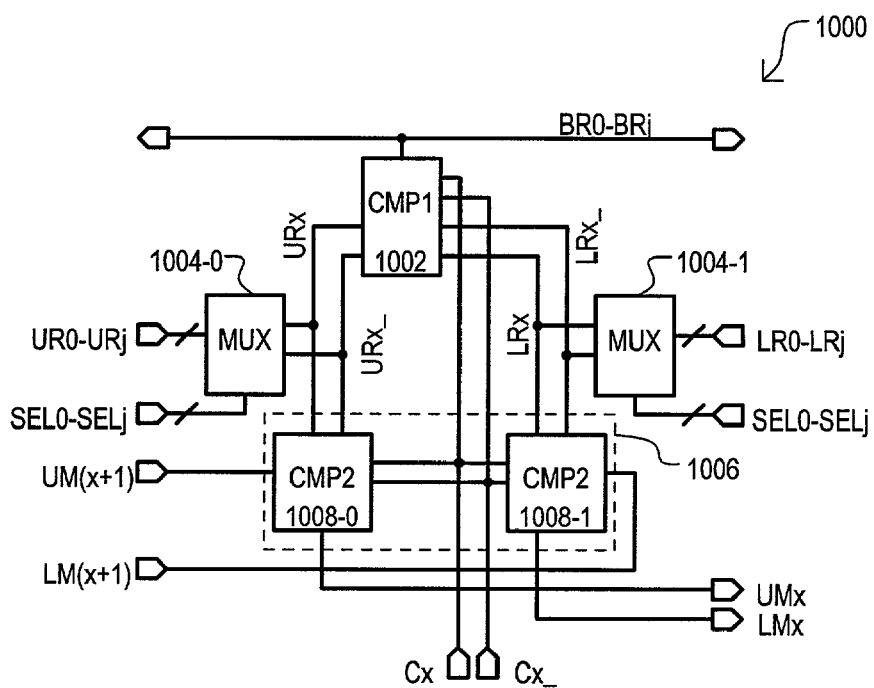
FIG. 10 is a block schematic diagram of a shared compare section according to an embodiment.

Referring now to FIG. 10, a more detailed example of a shared compare section is shown in a block schematic diagram and designated by the general reference character 1000.

A share compare section 1000 may include a first compare circuit 1002. A first compare circuit 1002 can function in a similar fashion to first compare circuits described above, and with reference to FIGS. 5-7. However, as shown in the figure, range values can be provided to a first compare circuit 1002 by way of multiplexer circuits 1004-0 and 1004-1.

A share compare section 1000 may also include a second compare circuit 1006. A second compare circuit 1006 can function in a similar fashion to second compare circuits described above, and with reference to FIG. 8. A second compare circuit 1006 may include a first range portion 1008-0 and a second range portion 1008-1.

In the particular example of FIG. 10, a first range portion 1008-0 can be an upper range portion, while a second range portion 1008-1 can be a lower range portion. In addition, range values can be provided to a second range circuit 1006 by way of multiplexer circuits (1004-0 and 1004-1).

Multiplexer circuit 1004-0 can receive multiple first range values (UR0-URj) and provide one of the values as an output according to a select signal SEL0 to SELj. Similarly, multiplexer circuit 1004-1 can receive multiple second range values (LR0-LRj) and provide one of the values as an output according to a select signal SEL0 to SELj.

Figure 11:
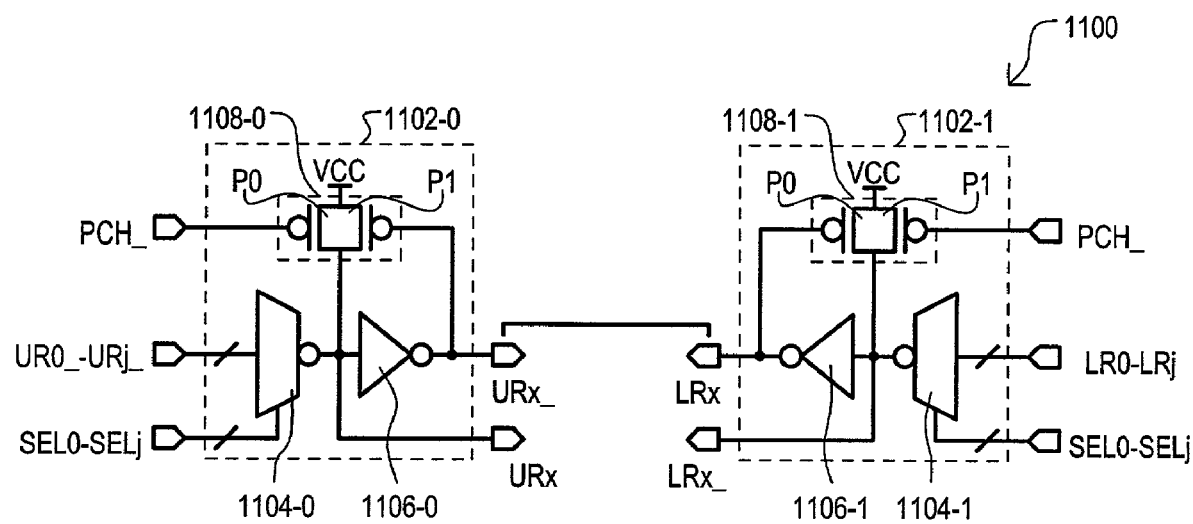
FIG. 11 is a schematic diagram of a multiplexer circuit that may be included in a shared compare section according to one embodiment.

Referring now to FIG. 11, examples of multiplexer circuits that may be included in a shared compare section are shown in a schematic diagram and designated by the general reference character 1100.

It is noted that while the circuits of FIG. 11 are identified as "multiplexer" circuits, such circuits can also generate and apply pre-discharge (and/or pre-charge) potentials for various other circuits. Accordingly, the term "multiplexer" should not be construed as limiting thereto.

A first multiplexer circuit 1102-0 may include a multiplexer 1104-0 that may receive multiple input values (UR0_-URj_) and select one such value according to select signals SEL0 to SELj. An output of multiplexer 1104-0 may be inverted and provided as an inverted output value URx. Such an inverted output value may be inverted once again by an inverter 1106-0 to generate an output value URx_.

A first multiplexer circuit 1102-0 may further include a pre-discharge circuit 1108-0 that may place an output value to a predetermined value. In the particular example of FIG. 11, a pre-discharge circuit 1108-0 can pre-discharge an output value URx_ to an inactive state (low in this case level). More particularly, a precharge circuit 1108-0 may include a precharge transistor P0 and a feedback transistor P1 having source-drain paths arranged in parallel between an output of multiplexer 1104-0 and a predetermined precharge voltage (VCC, in this case). A precharge transistor P0 may receive a precharge signal PCH_ at its gate, while a feedback transistor P1 may receive the output of inverter 1106-0 at its gate.

A second multiplexer circuit 1102-1 may have the same general configuration as a first multiplexer circuit 1102-0. It is noted that a second multiplexer circuit 1102-1 may receive lower range values LR0 to LRj as inputs. Further, a second multiplexer circuit 1102-1 may pre-discharge an output value LRx to an inactive state (low in this case level).

Referring to FIGS. 7 and 11, it is noted that in a first circuit path 702 a transistor N1 may receive an upper range value URx_. Similarly, a transistor N4 in second circuit path 704 may receive a lower range value LRx. If reference is made to FIG. 11, it can be seen that if a first and second multiplexer circuit (1102-0 and 1102-1) supply values URx_ and LRx to a first compare circuit of FIG. 7, during a pre-discharge operation, transistors N1 and N4 may be turned off. This can disable first and second circuit paths (702 and 704) (e.g., isolate a signal node 710 from a potential VSS). In this way, multiple sets of range values may be compared in a single, shared compare section. Such a configuration may provide for a more compact arrangement than approaches that may dedicate separate compare circuits for each bit of an entry. Of course, while the above examples have shown the sharing of one compare section among four locations, fewer or greater numbers of locations may share a same compare section.

Further, FIG. 11 shows how nodes may be set to predetermined voltages (pre-discharged). Such an arrangement may allow a range compare circuit to be "pre-conditioned" for rapid range match operations relative to conventional approaches.

Figure 12:
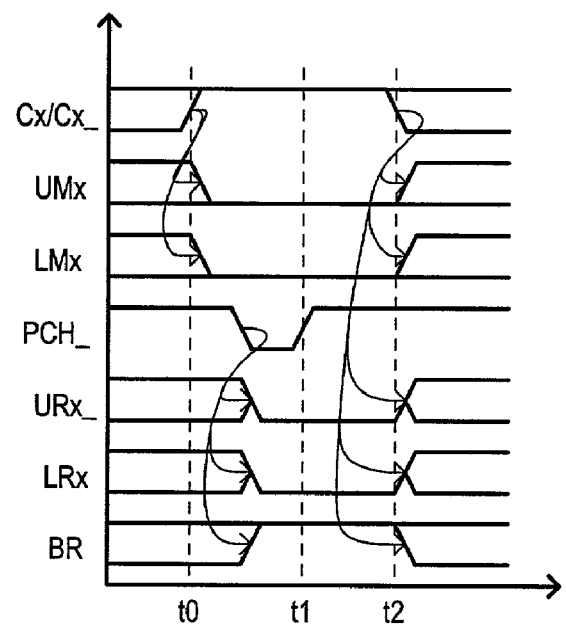
FIG. 12 is a timing diagram showing the operation of a range compare circuit according to an embodiment.
Figure 13:
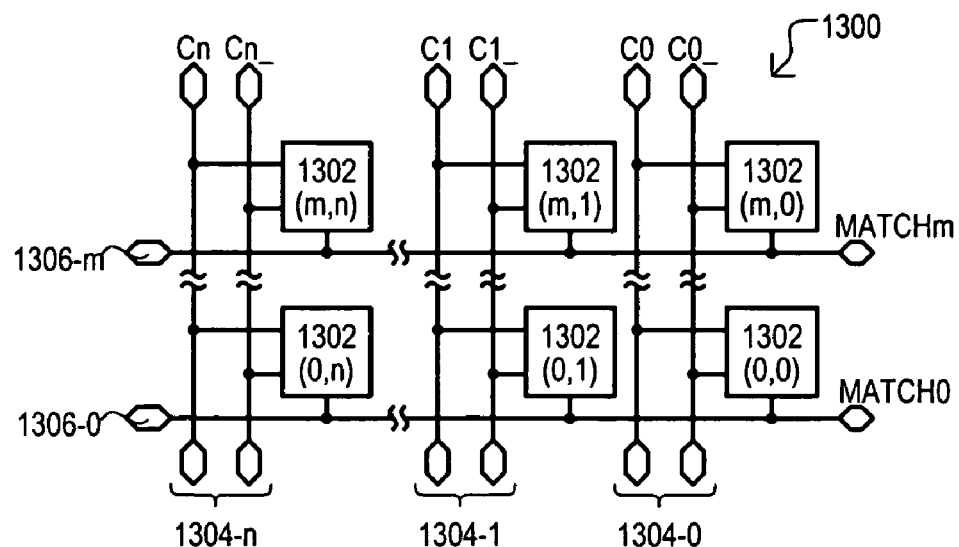
FIG. 13 is a block diagram of a conventional CAM cell array.
Figure 14:
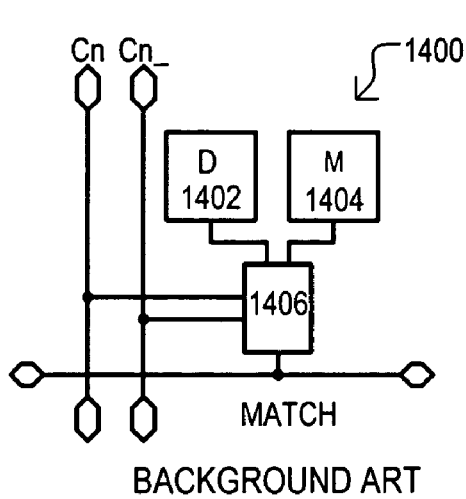
FIG. 14 is a block diagram of a conventional ternary CAM cell.
Figure 15:
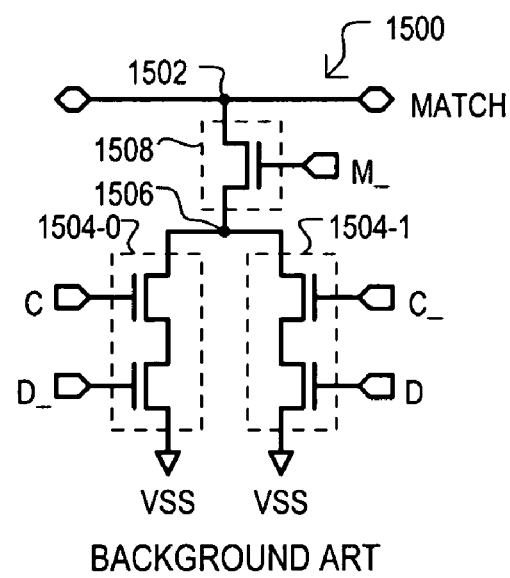
FIG. 15 is a schematic diagram of a compare circuit for a ternary CAM cell.

A timing diagram showing a range compare operation according to one embodiment is set forth in FIG. 12. FIG. 12 includes various signals previously described. In describing FIG. 12, it will be assumed that a range compare circuit has the various components set forth in FIGS. 7, 8A-8C, and 11.

Referring now to FIG. 12 in conjunction with FIGS. 7, 8A-8C, and 11, at time t0, comparand values Cx and Cx_ may both be driven to a same potential, high in this case. Due to a passgate-type XOR arrangement (such as that of FIGS. 8B and 8C), such an action can result in a logic high output from XOR gates 806 and 812. As can be seen from FIG. 8A, assuming that a mode signal RNGE is high, a high output from XOR gates 806 and 812 can force upper range match value UMx and lower range match value LMx to inactive (low) values.

Referring to FIG. 7, inactive upper and lower range match values (UM(x+1) and LM(x+1)) can essentially disable first and second circuit paths (702 and 704) by turning off transistors N2 and N5.

In addition, a precharge signal PCH_ may transition to an active (low) state. As understood from FIG. 11, when precharge signal PCH_ goes low, upper range value URx_ and lower range value LRx can be pre-discharged. As noted above, this can also disable first and second circuit paths (702 and 704) by turning off transistors N1 and N4. A precharge signal PCH_ may also result in an output BRx being precharged to a high level.

At time t1, a precharge signal PCH_ can return to an inactive (high) state. At this time a range compare circuit may be precharged and preconditioned for a range compare operation. Thus, at time t2, a comparand value may be applied, and a range compare operation may be executed as described above.

It is understood that while various embodiments have been described in detail, the present invention could be subject various changes, substitutions, and alterations without departing from the spirit and scope of the invention. Accordingly, the present invention is intended to be limited only as defined by the appended claims.

What is claimed is:

1. A range compare circuit, comprising:
at least one first storage location for storing a first range value that defines one limit of a range that includes multiple compare values, the first range value including a plurality of first range bit values;
at least one second storage location for storing a second range value that defines a second limit of the range, the second range value including a plurality of second range bit values; and
a plurality of compare sections that compare same portions of a comparand value to corresponding portions of both the first and second range values, the comparand value including a plurality of comparand bit values, and each compare section including
a first compare circuit having a first circuit path that is disabled and enabled according to a corresponding bit of the comparand value and a bit of the first range value, and a second circuit path that is enabled and disabled according to a corresponding comparand bit value and a second range bit value, wherein
the first circuit path is in parallel with the second circuit path and the first and second circuit paths are commonly coupled to a signal node.

2. The range compare circuit of claim 1, further including:
a precharge circuit that disables the first circuit path in response to an active precharge signal.

3. The range compare circuit of claim 1, wherein:
the plurality of compare sections have a significance with respect to one another and each compare section includes a second compare circuit that receives a more significant first range match result and provides a less significant first range match result.

4. The range compare circuit of claim 3, wherein:
the more significant match result includes a first limit match result and a second limit match result.

5. The range compare circuit of claim 3, wherein:
the second range value includes a plurality of second range bit values; and
each second compare circuit receives a more significant second range match result and provides a less significant second range match result.

6. A range compare content addressable memory (CAM), comprising:
a plurality of range compare circuits that each determines if at least a portion of a comparand value is within a range defined by a corresponding first range value and a second range value;
a multiplexer having inputs coupled to receive different portions of the comparand value, and an output coupled to each range compare circuit; and
a compare section that compares at least a portion of the comparand value to data stored in a plurality of entries, the compare section generating an active match result when the at least a portion of the comparand value matches at least one entry.

7. The range compare CAM of claim 6, wherein:
each range compare circuit is coupled to a corresponding first and second store pair, each first and second store pair storing the corresponding first and second range values, each range compare circuit comparing the same portion of the comparand value to the corresponding first and second range values.

8. The range compare CAM of claim 6, wherein:
each range compare circuit includes an output coupled to a priority encoder.

9. A circuit, comprising:
a plurality of result lines;
a plurality of compare section groups, each compare section group coupled to a different one of the result lines, each compare section group including a plurality of compare sections that each couple the corresponding result line to a first potential according to a comparison between at least a same portion of a comparand value and both a first range value and a second range value; and
the compare sections of the same compare section group each have a significance with respect to one another, the more significant compare sections providing a comparison result to at least one less significant compare section, the comparison result including a comparison between at least the same portion of the comparand value and both the first and second range values, each compare section including a second compare circuit that provides a comparison result between the same at least portion of the comparand value and at least of portion of the first and second range values to a compare section of less significance within the same compare section group, the second compare circuit generating an inactive comparison result in response to complementary comparand value lines being driven to a same logic level.

10. The circuit of claim 9, wherein:
a first storage circuit for storing the first range value and a second storage circuit for storing the second range value.

11. The circuit of claim 9, wherein:
each compare section includes a first compare circuit coupled to the corresponding result line and a second compare circuit coupled to the first compare circuit of at least one compare section of less significance within the same compare section group.

12. The circuit of claim 9, further including:
a precharge circuit that disables current paths in at least one compare section in response to a precharge signal.

13. The circuit of claim 9, further including:
a precharge circuit that disables current paths in at least one compare section in response to a precharge signal.

* * * * *